(12) United States Patent
Huang et al.

(10) Patent No.: US 7,466,179 B2
(45) Date of Patent: Dec. 16, 2008

(54) PHASE INTERPOLATION CIRCUIT

(75) Inventors: Chen-Chih Huang, Hsinchu (TW);
Pao-Cheng Chiu, Hsinchu (TW)

(73) Assignee: Realtek Semiconductor Corporation,
Hsinchu (TW)

( * ) Notice: Subject to any disclaimer, the term of this patent is extended or adjusted under 35 U.S.C. 154(b) by 255 days.

(21) Appl. No.: 10/773,450

(22) Filed: Dec. 2, 2004

(65) Prior Publication Data

US 2006/0022734 A1    Feb. 2, 2006

Related U.S. Application Data

(63) Continuation-in-part of application No. 10/079,866, filed on Feb. 21, 2002, now Pat. No. 6,727,741.

(30) Foreign Application Priority Data

Feb. 22, 2001    (TW)    .............................. 90104097 A

(51) Int. Cl.
*H03H 11/16*    (2006.01)
(52) U.S. Cl. ...................... 327/258; 327/231
(58) Field of Classification Search ................. 327/231, 327/233, 237, 256, 257–259, 293, 295, 391, 327/403, 407, 170
See application file for complete search history.

(56) References Cited

U.S. PATENT DOCUMENTS 3,890,580 A * 6/1975 Kuhn et al. ............ 331/116 FE
5,012,141 A * 4/1991 Tomisawa .................... 327/276
5,296,757 A * 3/1994 Koizumi ....................... 326/21
6,198,334 B1 * 3/2001 Tomobe et al. .............. 327/391
6,225,847 B1 * 5/2001 Kim ............................ 327/257
2002/0030525 A1 * 3/2002 Saeki .......................... 327/291

FOREIGN PATENT DOCUMENTS

JP    2002-14743    *    1/2002

OTHER PUBLICATIONS

Hervé Marie and Philippe Belin, R, G, B Acquisition Interface with Line-Locked Clock Generator for Flat Panel Display, IEEE Journal of Solid-State Circuits, Jul. 1998, pp. 1009-1013, vol. 33, No. 7, Philips Semiconductors, Caen, France.

* cited by examiner

*Primary Examiner*—Lincoln Donovan
*Assistant Examiner*—Thomas J Hiltunen
(74) *Attorney, Agent, or Firm*—Rabin & Berdo, P.C.

(57)    ABSTRACT

The invention relates to a phase-interpolation circuit and a phase-interpolation signal generating circuit applying the phase-interpolation circuit. The phase-interpolation circuit can avoid short-circuit current effectively. In addition, an inter-phase signal can be interpolated between the rising edge and the falling edge of the clock pulse. The phase-interpolation signal generating device can generate multiphase clock signals which not only have linearly distributed phases but also maintain good 50% duty cycle of the multiphase clock signals.

21 Claims, 9 Drawing Sheets

PHASE INTERPOLATION CIRCUIT

CROSS REFERENCE TO RELATED APPLICATIONS

This is a continuation-in-part of application Ser. No. 10/079,866 filed on Feb. 21, 2002, now U.S. Pat. No. 6,727,741, entitled "A Phase-Interpolation Circuit and A Phase-Interpolation Signal Generating Device Applying the Same" and assigned to the same assignee, the contents of which are incorporated herein by reference.

BACKGROUND OF THE INVENTION (1) Field of the Invention

The present invention relates to a phase-interpolation circuit, more particularly, a phase-interpolation circuit which can avoid short-circuit current and generate linearly distributed phase-interpolation signals.

(2) Description of the Prior Arts

Multiphase systems are widely applied in the data-recovery systems and the phase-lock loop circuits. The multiphase systems are also a main trend of design in the communication systems nowadays.

In a conventional data recovery system, after applying the equalizer to recover high frequency decayed signals resulting from noise of communication media and signal decay, the correct sampling of data streams still depends on the correct clock pulse. In addition, the rising/falling edges of the clock pulses need to be in the middle of the data period to sample them correctly. The conventional data recovery system uses a phase-lock loop circuit to achieve the clock-recovery in order to correct the received data stream and sampling clock pulses. However, several disadvantages exist when the phase-lock loop circuit is used for recovering the clock-pulse, including: (a) Longer lock time. The function of the phase-lock loop circuit rectifying the phase is to use the output signal reference frequency and the voltage-controlled oscillator to compare with each other and transfer the result to the voltage signal. The feedback of the input of the voltage-controlled oscillator rectifies the frequency in order to accelerate or slow down the phase. The process of the rectification of the phase has to compare many clock-pulse cycles with each other in order to achieve the phase needed. Maybe several hundreds of the clock-pulse cycles are needed for the comparison. As a result, longer lock-time is required. (b) Phase noise. The input voltage of the voltage-controlled oscillator of the phase-lock loop circuit will lead the frequency drift when the noise disturbs. The result above is the phase noise. When clock-pulse is recovering, comparison of phases also depends on sequence of the received data stream. Because the rising and falling edges of the signal do not vary when a long and same logical signal inputs, the phase detector won't work. Under such condition, the phase-lock loop circuit is unable to maintain the phase-lock state and the frequency will start to drift, and, as a result, the phase noise is generated in the frequency spectrum. (c) Only one receiving channel is available. Only one receiving channel can be provided when we achieve the clock-pulse recovery by using the phase-lock loop circuit. We have to recover the clock-pulse by using more phase-lock loop circuits for a plurality of receiving channels.

Therefore, multiphase systems have become a trend for data-recovery systems during the recent years. Since multiphases may be distributed in one clock-pulse, the above mentioned phase-lock process can be achieved by selecting a suitable sampling clock-pulse. Not only phase-lock time is shorter, we can also provide a phase-lock loop circuit for use with a plurality of receiving channels. There are several methods to generate multiphase signals, including: (a) Delay-Lock loop. Using a long series of delay chain, such as two inverters connected in serial, to generate clock-pulse signals having different delay duration so as to form the multiphase signals. The advantage for this method is the stability. However, it also incurs the drawbacks of requiring lots of delay units for covering 360 degrees of clock-pulse phases, higher cost, fewer applications available, more electric power decay, and inevitable noise disturbance occurred from electrical power lines. (b) Multiphase VCO. Currently, the newly developed multiphase oscillators are able to generate refined differences of phases uniformly distributed within one clock-pulse. In addition, the number of the generated multiphase signals can be the power of two. However, one of the difficulties is to avoid the problem of the multiphase oscillator model. The circuit layout is also an important consideration for this method. (c) The phase interpolation. The phase interpolation is one of the ways to generate the multiphase signals. A middle phase can be output by inputting different phases. The way to use the phase interpolation is easier and is the trend for future technology.

The advantages of the phase interpolation in comparison with the above mentioned conventional techniques are following: (a) It won't be limited by the delay time of the delay unit to decide the distribution density of the multiphase. The multiphase density and number can be easily decided by phase interpolation. The cost and the decaying power will balance in the design. The system is also very stable. (b) There is no disadvantage of the multi-oscillating model. And the number of the phases will increase by doubling the number of the input phase after the interpolation. For example, we can interpolate 8 phases once if we need 16 phases. (8*2=16) If we need 20 phases then we can interpolate 10 phases once. (10*2=20) Or, to interpolate 5 phases twice can also obtain the same result. The design is very free. (c) Because the phase-interpolation can produce the local multiphase clock signals by using fewer phases of the globe clock signals, therefore the area of the wiring and the number of the clock-pulse buffers will be fewer than the decay-lock-loop circuit and the multiphase oscillator in the application of the multi-receiving channels.

Conventional phase-interpolation methods include the type of non-full swing signal and the type of full swing signal. The phase-interpolation of the non-full swing signal type generally employs the V-to-I current adder. The middle phase can be generated by adding two signals with two different phases. A set of binary code or temperature code is applied to control the tail current of the circuit and to rectify the weighting of the adding signals. As a result, the phase of the interpolation produced can be controlled to drift backward or forward. The distribution of the phase is not distributed in one clock-pulse period uniformly because the phase of the interpolation of the analog signal is decided by the rating of the tail current of the current adder. The switch of the phase boundary is non-seamless. We have to get the analog signal near the position of the voltage-controlled oscillator for the phase interpolation because the input clock signal is non-full swing signal. The result above will limit the application of the data-recovery system of the multi-receiving channel described above. The phase interpolation of the full swing signal will provide fewer globe clock signals of the phase to produce near local multiphase clock. The characteristic above is the advantage of the full swing signal type.

The disadvantages of the phase-interpolation method in the type of conventional full swing signal type include: (a) The decaying power of the short-circuit current is large. (b) The nonlinear phase distribution. (c) The duty cycle of the clock-pulse output is not 50%. The phase-interpolation circuit of the full swing signal type in prior art is composed of two inverters 11 and 12 as which shown in FIG. 1A. And the inverters are composed of the CMOS devices, as which illustrated in FIG. 1B. The principle of the operation of the devices is to provide two-level clock signals CK1 and CK2. As shown in FIG. 1C, the phase of CK1 is before the phase of CK2 in order to produce an output signal with middle phase by short-circuit of the two inverters. However, as indicated by the arrow shown in FIG. 1B, the circuit will produce a short-circuit current Isc when the time is T1 and T2 and when the clock signal CK1 is in the input end 111 and the clock signal CK2 is in the input end 121. The disadvantage of large decaying power in the circuit exists. And the phase of the interpolation signal produced cannot be controlled in the middle range of the phase of the original signals.

Please refer to FIG. 1D which is a schematic diagram illustrating an improved prior art circuit employing the above mentioned method. The circuit shown in FIG. 1D can correct the defects of the phase of the interpolation signal to be in the middle of the two original phases by fine tuning the current ratio of both discharging paths (e.g., to control the ratio of tail current). However, such kind of method can only improve the linearity of the distribution of the phase by means of the ratio of current (e.g., W and 1-W shown in FIG. 1D), which is difficult to be controlled concisely. This method cannot achieve the yield of the mass production and cannot maintain the duty cycle of the original clock-pulse. It will require an additional duty cycle correction circuit to maintain the 50% duty cycle.

FIG. 2A describes another prior art circuit, in which a phase-interpolation circuit that can avoid short-circuit current is provided. However, it also incurs the drawback of being only able to produce the interpolation phase for the falling edge of the clock pulse, but cannot provide the interpolation phase for both the rising and falling edges of the clock pulse (as which shown in FIG. 2B). Therefore, such kind of circuit can only be used for doubling the frequency of multiphase clock pulse. And it will not produce a new middle phase for the doubled frequency. The primary object of the present invention is to improve the deficiencies of the above mentioned conventional phase-interpolation circuits. The following description is going to disclose a novel phase-interpolation circuit which can avoid short-circuit current, provide linearly distributed multiphase clock pulse, and maintain 50% duty cycle constantly. In addition, by applying the novel phase-interpolation circuit of the present invention, we don't have to design additional duty cycle correction circuit. Moreover, we will be able to interpolate new middle phase between both the rising and falling edges of the clock pulse for the full swing signal type (digital type) phase-interpolation circuit.

SUMMARY OF THE INVENTION

It is one of the object of the present invention is to provide a phase-interpolation circuit which can avoid short-circuit current and generate linearly distributed phase-interpolation signals.

The phase-interpolation circuit disclosed to the embodiment of the present invention comprises: a first inverter for receiving the first clock signal; a second inverter for receiving the second clock signal, wherein an output end of the second inverter is coupled to an output end of the first inverter to form a common output end to output the third clock signal; a first controlled switch coupled to the first inverter, the second inverter, and a power source, wherein the first controlled switch being "off" when the first clock signal is in a fist state, and being "on" when the first clock signal is in a second state; and a second controlled switch coupled to the first inverter, the second inverter, and ground, wherein the second controlled switch being "on" when the first clock signal is in the first state, and being "off" when the first clock signal is in the second state. The phase of the third clock signal is determined by the phase of the first clock signal and the second clock signal and the first controlled switch and the second controlled switch are to avoid a short-circuit current of the phase-interpolation circuit.

These and other objectives of the claimed invention will no doubt become obvious to those of ordinary skill in the art after reading the following detailed description of the preferred embodiment that is illustrated in the various figures and drawings.

DETAILED DESCRIPTION OF THE PREFERRED EMBODIMENTS

Figure 1A:
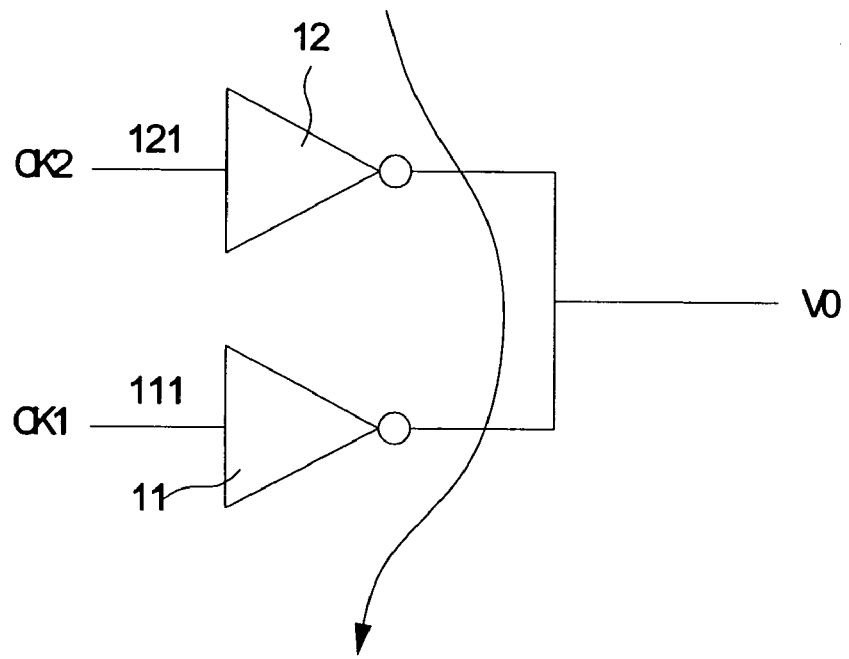
FIG. 1A is a schematic diagram of the first example of the conventional phase-interpolation circuit of full swing signal type (digital type).
Figure 1B:
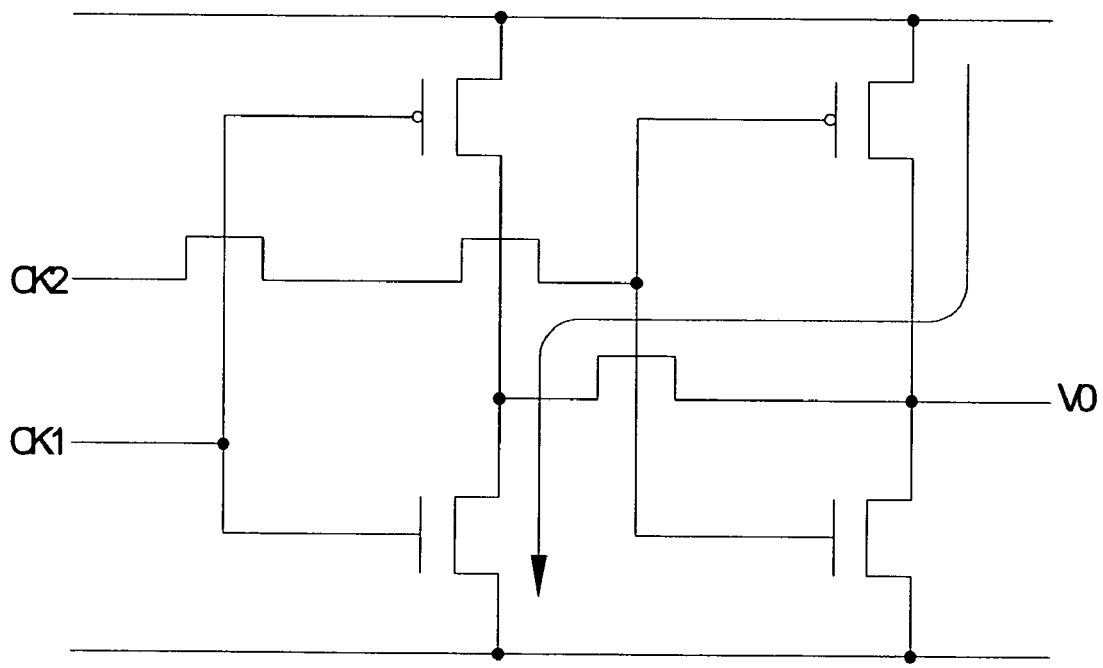
FIG. 1B is a schematic diagram showing the second example of conventional phase-interpolation circuit including inverters composed of the CMOS.
Figure 1C:
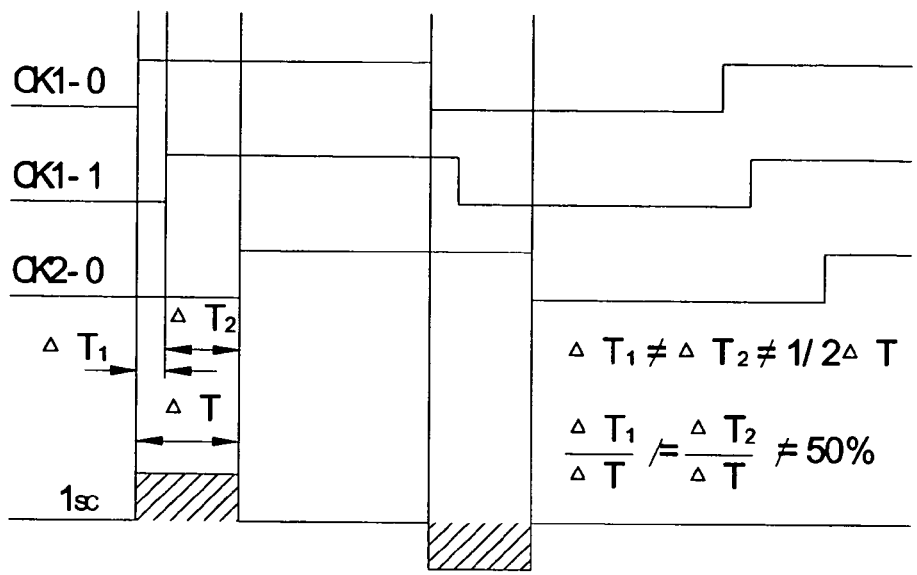
FIG. 1C is a schematic diagram showing the waveform of the clock signals CK1 and CK2 provided by a conventional input phase-interpolation circuit.
Figure 1D:
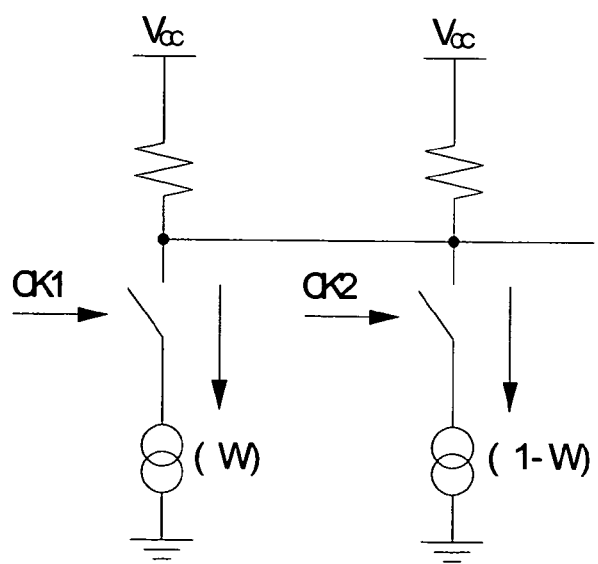
FIG. 1D is a schematic diagram showing the third example of conventional phase-interpolation circuit.
Figure 2A:
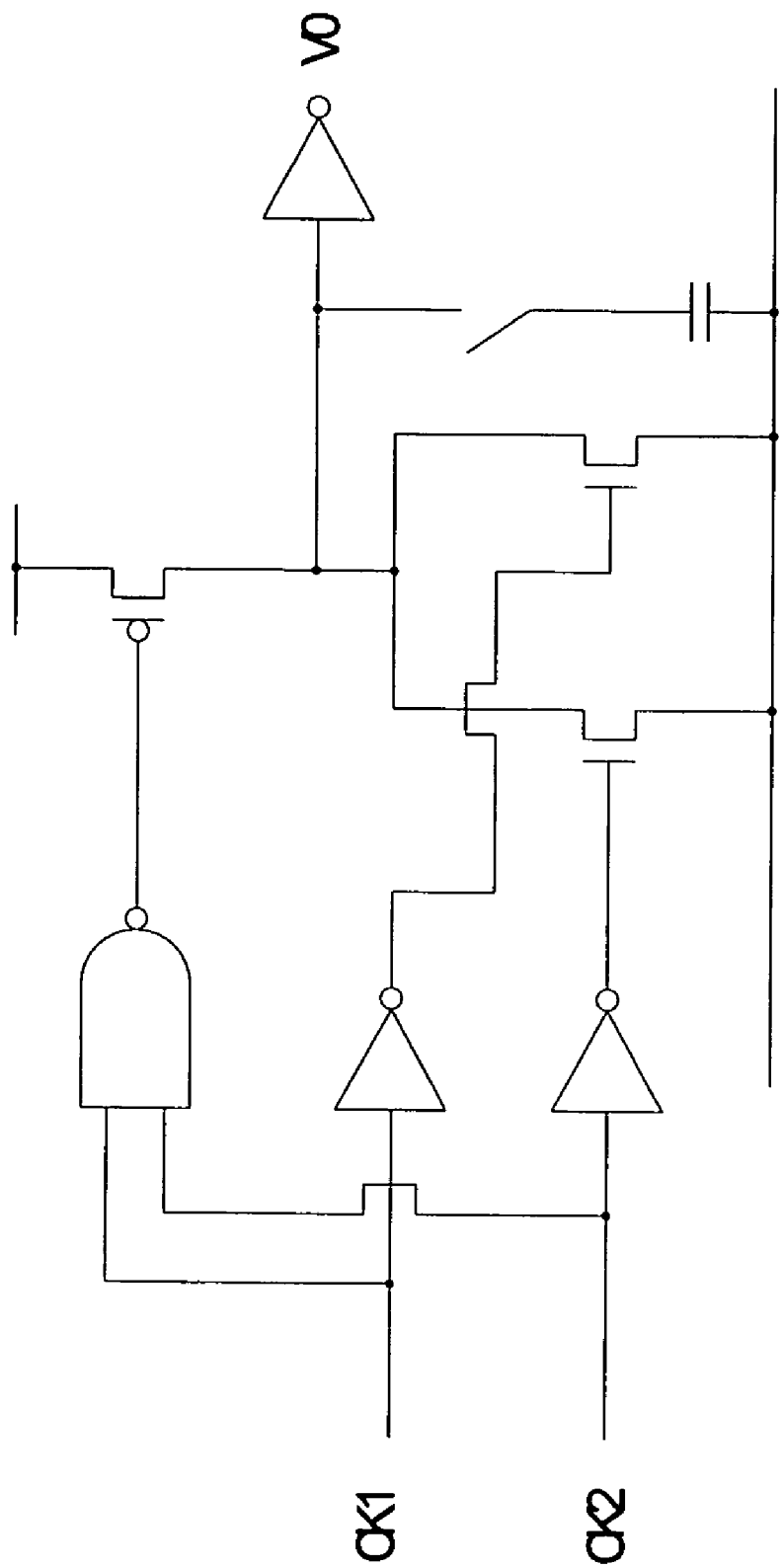
FIG. 2A is a schematic diagram showing the forth example of conventional phase-interpolation circuit to avoid short-circuit current.
Figure 2B:
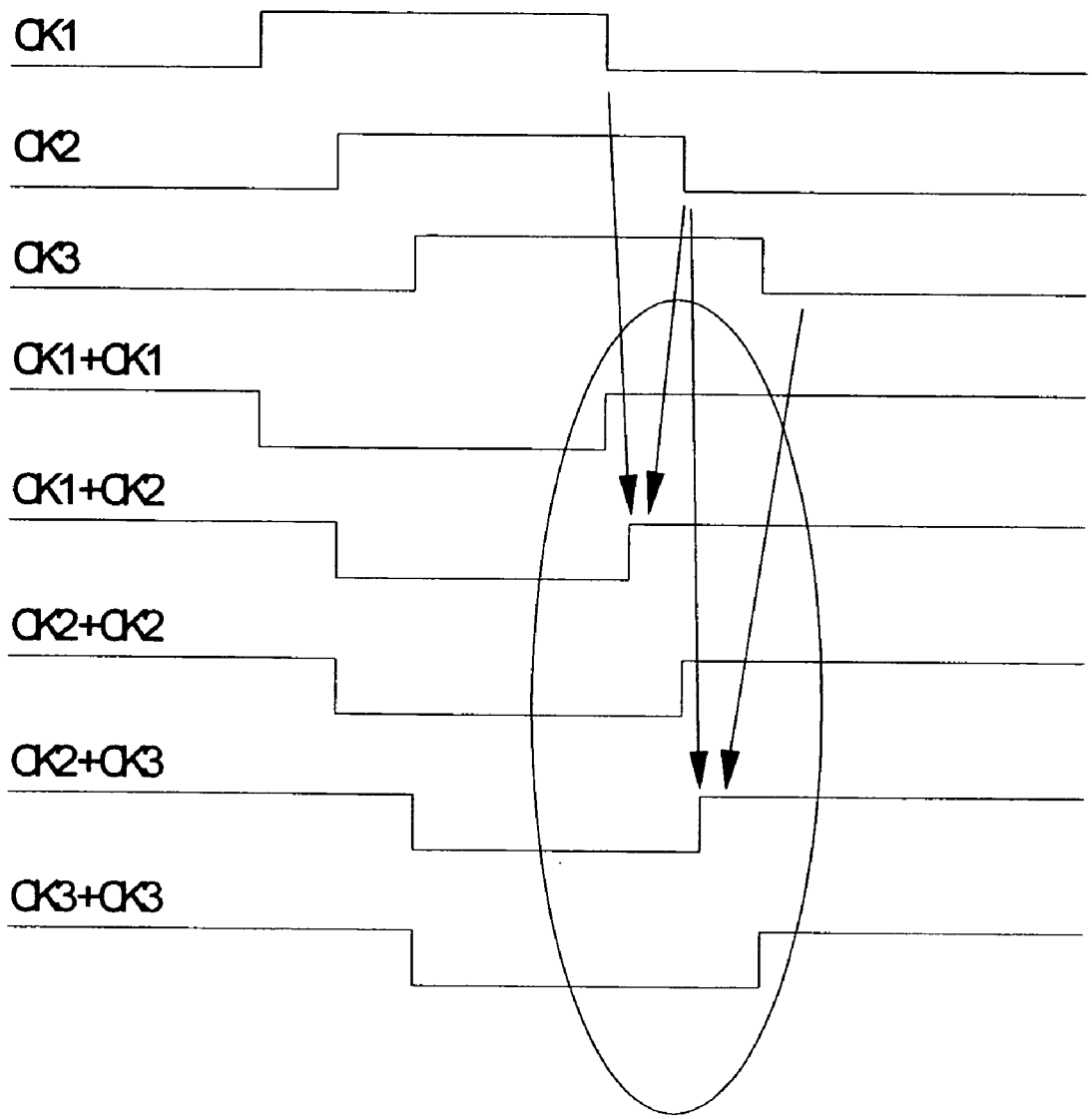
FIG. 2B is a schematic diagram showing the waveform of the conventional phase-interpolation circuit shown in FIG. 2A.
Figure 3:
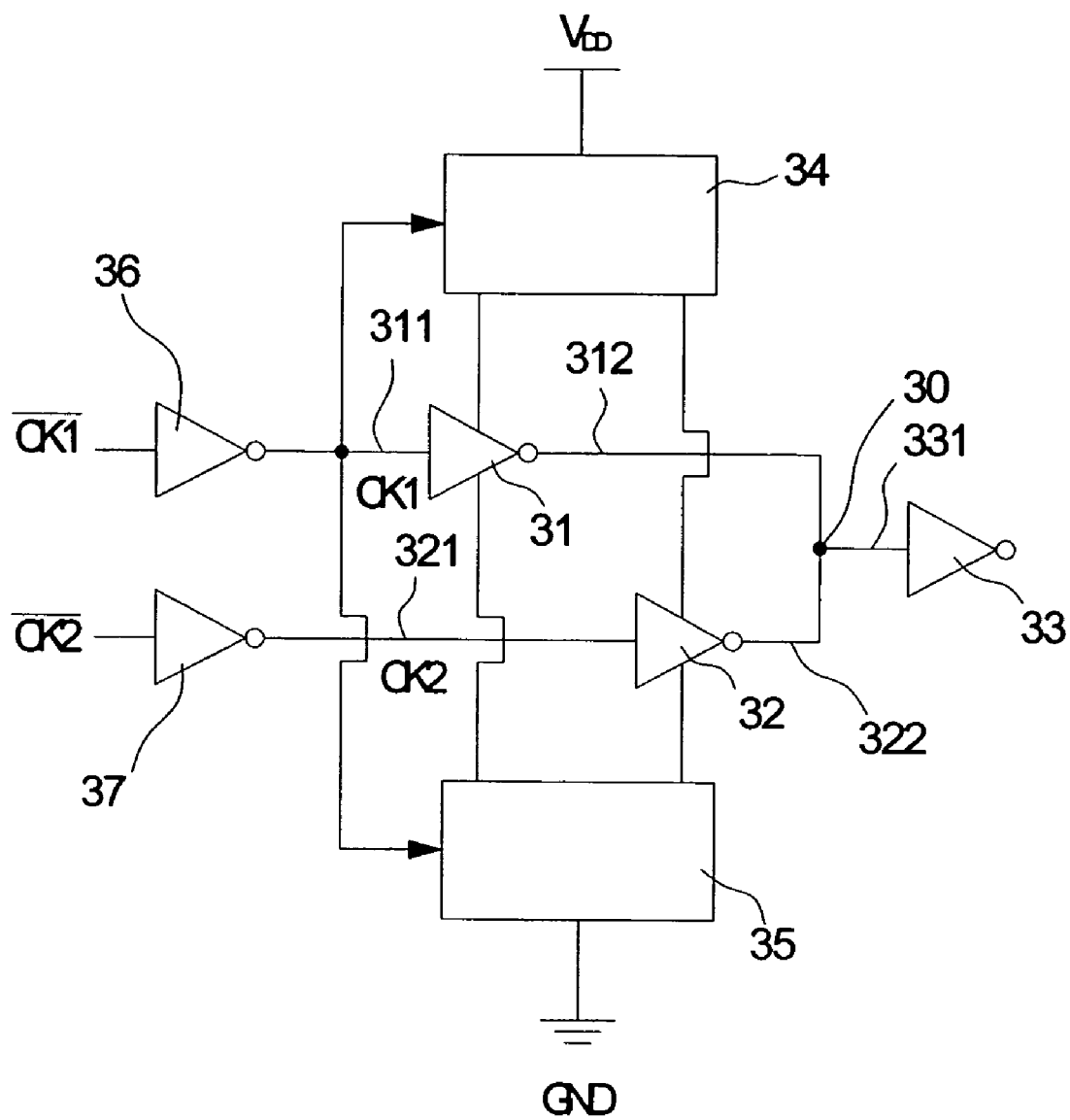
FIG. 3 illustrates a schematic diagram of a preferred embodiment of the phase-interpolation circuit of the present invention.

Please refer to FIG. 3, which is a schematic diagram of a preferred embodiment of the phase-interpolation circuit of the present invention. The phase-interpolation circuit shown in FIG. 3 includes five inverters and two controlled switches. The input end 311 of the first inverter 31 receives a phase-leading clock signal CK1. And the input end 321 of the second inverter 32 receives a phase-following clock signal CK2. And the output end 322 of the second inverter 32 is connected to the output end 312 of the first inverter 31 to form a common output end 30. The input end 331 of the third inverter 33 connects to the common output end 30 electrically. The output ends of the fourth inverter 36 and the fifth inverter 37 are connected to the input ends of the first inverter 31 and the second inverter 32 respectively.

The circuit further includes the first controlled switch 34 and the second controlled switch 35 to avoid short-circuit current in the present invention. The first controlled switch 34 connects between the first inverter 31 and the second inverter 32 and the electrical power source (VDD). The switch 34 is off when the clock signal CK1 is in the high-level state. The switch 34 will be turn on when the clock signal CK1 is in the low-level state. The second controlled switch 35 connects between the first inverter 31 and the second inverter 32 and the ground (GND) electrically. The second controlled switch 35 is on when the clock signal CK1 is in the high-level state. And the second controlled switch 35 is off when the clock signal CK1 is in the low-level state. By controlling the timing of the open/close states of the controlled switches 34 and 35 with the clock signal CK1, short-circuit current can be omitted.

Figure 4A:
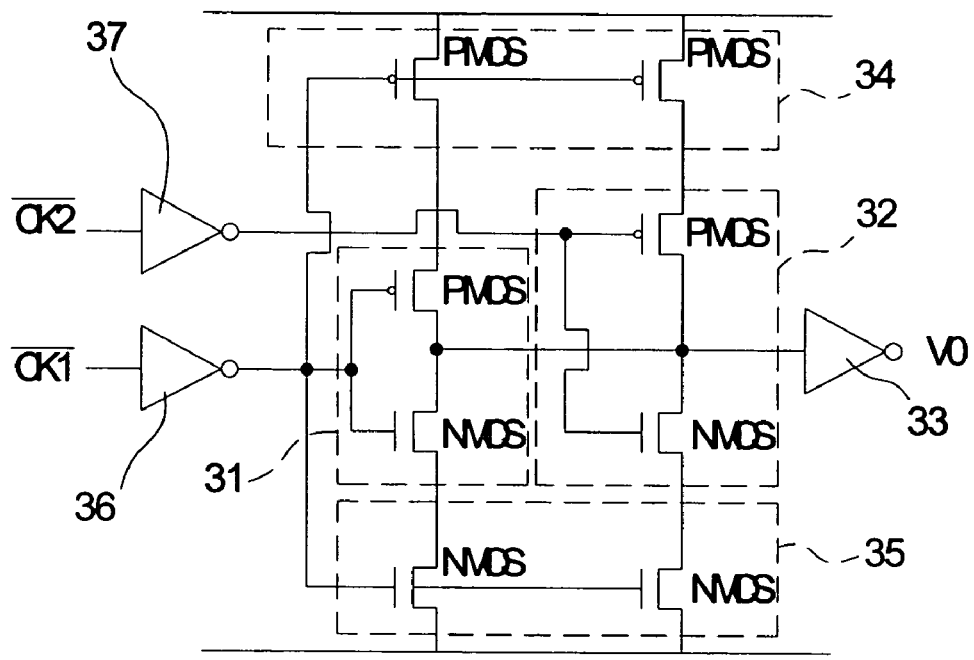
FIG. 4A and FIG. 4B illustrate two examples for using MOS to accomplish the controlled switch circuit disclosed in the embodiment of the present invention.
Figure 4B:
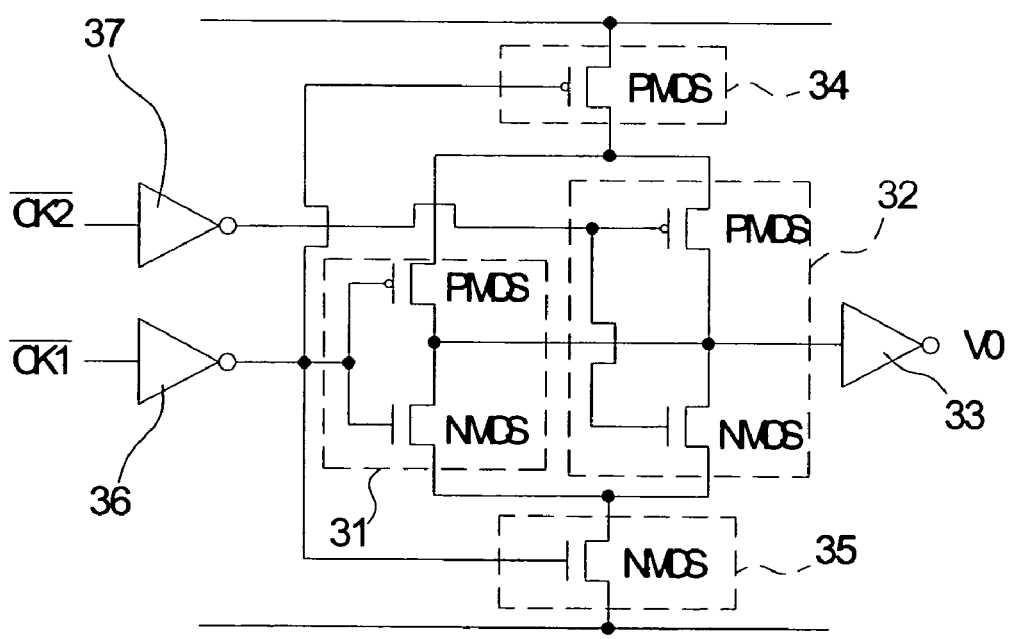
Figure 5:
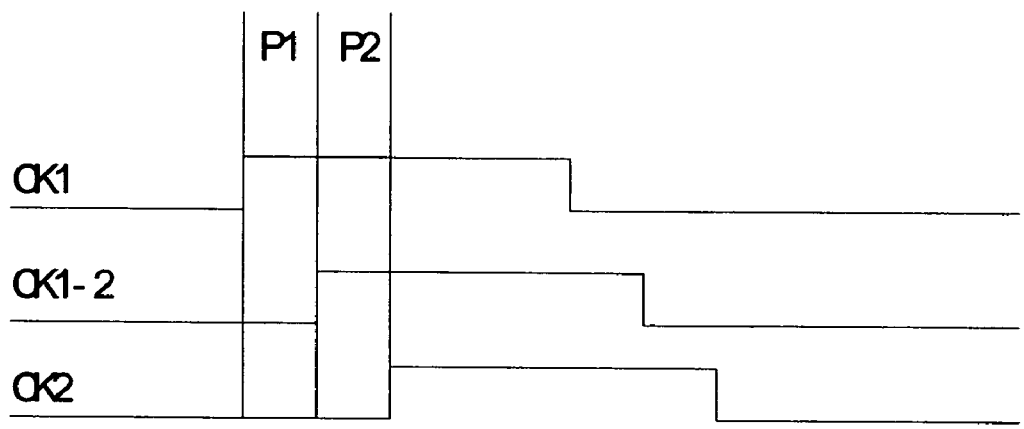
FIG. 5 is a schematic diagram illustrating the waveform including the clock signal CK1-2 outputted by the phase-interpolation circuit and the clock signal CK1 inputted in the phase-interpolation circuit.

Please refer to FIG. 4A and FIG. 4B. The inverter shown in FIG. 4A and FIG. 4B is composed of CMOS inverters. In the following description, we will let "1" represent the high-level state and let "0" represent the low-level state for illustration convenience. When the state of (CK1,CK1) is changing from (0,0) to (1,0) to (1,1), and when CK1 rises from "0" to "1", the clock signal CK2 will also rise from "0" after then. In the same time, the common output end 30 is going to fall from "1" to "0". The PMOS in the controlled switch will be off and the NMOS in the controlled switch will be on when CK1="1". Because the VDD is disconnected now, therefore the short-circuit current will not be generated even when the NMOS of the first inverter 31 is on and the PMOS of the second inverter 32 is on to form a short-circuit path and when (CK1,CK2) is equal to (1,0). The function of the common output end 30 also matches the need of phase-interpolation since the dispersion capacitor thereof will discharge to "0" gradually. Vice versa, when (CK1,CK2) is changing from (1,1)-(0,1)-(0,0). The clock signal CK2 will fall down from "1" after the CK1 fall down to "0". In the same time, the common output end will rise from "0" to "1". The PMOS will be on and the NMOS will be off when CK1="0". Because the connection toward GND is off now, therefore the short-circuit current will not be generated even when (CK1,CK2) is equal to (0,1) and the PMOS of the first inverter 31 and the NMOS of the second inverter 32 are both on to form a short-circuit path there between. And the common output end 30 matches the need of the phase-interpolation function because the dispersion capacitor will charge to "1" gradually. The signal comes from the common output end 30 will be further processed by the third inverter 33 so as to output the wave forms shown in FIG. 5. In which, the output clock signal CK1-2 is right between CK1 and CK2. The electric power decay can be minimized in the present invention because we effectively avoid the short-circuit current.

However, since the middle phase signal is generated by the charging/discharging processes of the capacitors of different inverters controlled by different clock pulses with different phases, therefore the middle phase signal might drift toward one of the neighbor phases (e.g., P1 is unequal to P2 in FIG. 5) if the charging/discharging speed or ratio is improper or not precisely controlled. As a result, the 50% duty cycle may drift. Although the error of the middle phase might be smaller than 3% if suitable parameters are adjusted, however, many uncertainties such like changing of temperature, manufacturing error and dispersion capacitors may still make the middle phase to drift away from the ideal value.

Figure 6:
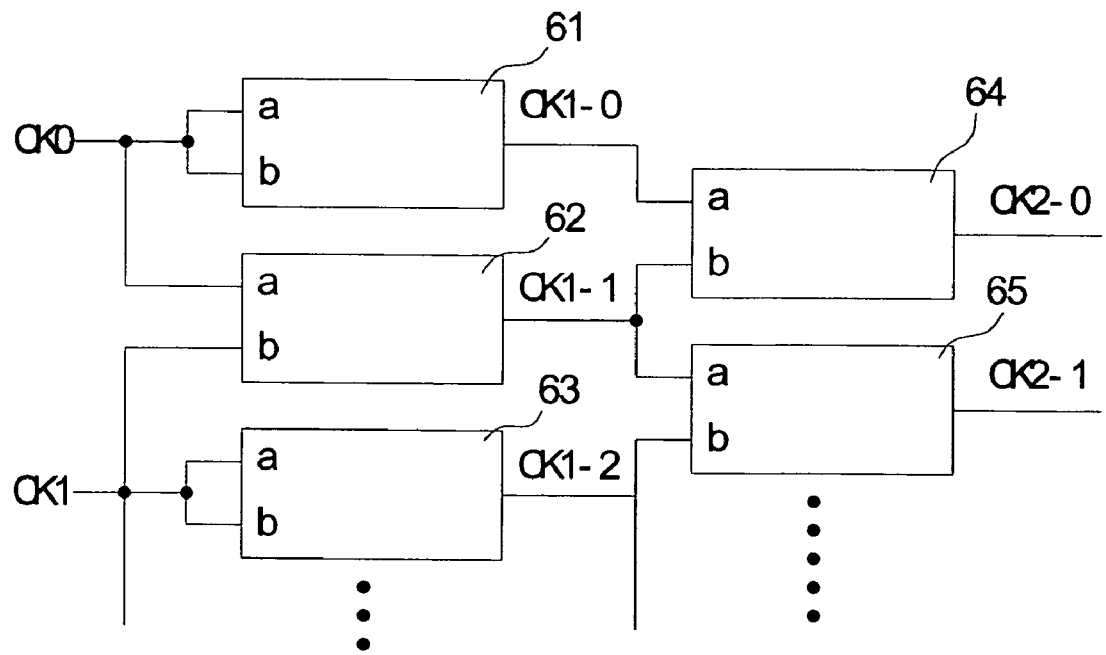
FIG. 6 is a schematic diagram illustrating a preferred embodiment of the phase-interpolation signal generating device of the present invention.

To resolve this problem, the present invention discloses a phase-interpolation generated device as shown in FIG. 6. The device comprises five phase-interpolation circuits. Each phase-interpolation circuit can be accomplished by using the circuit illustrated in FIG. 3. These five phase-interpolation circuits include the first phase-interpolation circuit 61, the second phase-interpolation circuit 62, the third phase-interpolation circuit 63, the fourth phase-interpolation circuit 64 and the fifth phase-interpolation circuit 65. The both input ends of the first phase-interpolation circuit 61 are connected to receive the first clock signal CK0. And the two input ends of the second phase-interpolation circuit 62 are separately directed to receive the first clock signal CK0 and the second clock signal CK1 respectively. And the both input ends of the third phase-interpolation circuit 63 receive the second clock signal CK1. And the two input ends of the fourth phase-interpolation circuit 64 are separately connected to the output ends of the first phase-interpolation circuit 61 and the second phase-interpolation circuit 62 respectively. And the output end of the fourth phase-interpolation circuit 64 will output the third clock signal CK2-0. The two input ends of the fifth phase-interpolation circuit 65 are respectively connected to the output ends of the second phase-interpolation circuit 62 and the third phase-interpolation circuit 63. And the output end of the fifth phase-interpolation circuit 65 outputs the fourth clock signal CK2-1.

Figure 7:
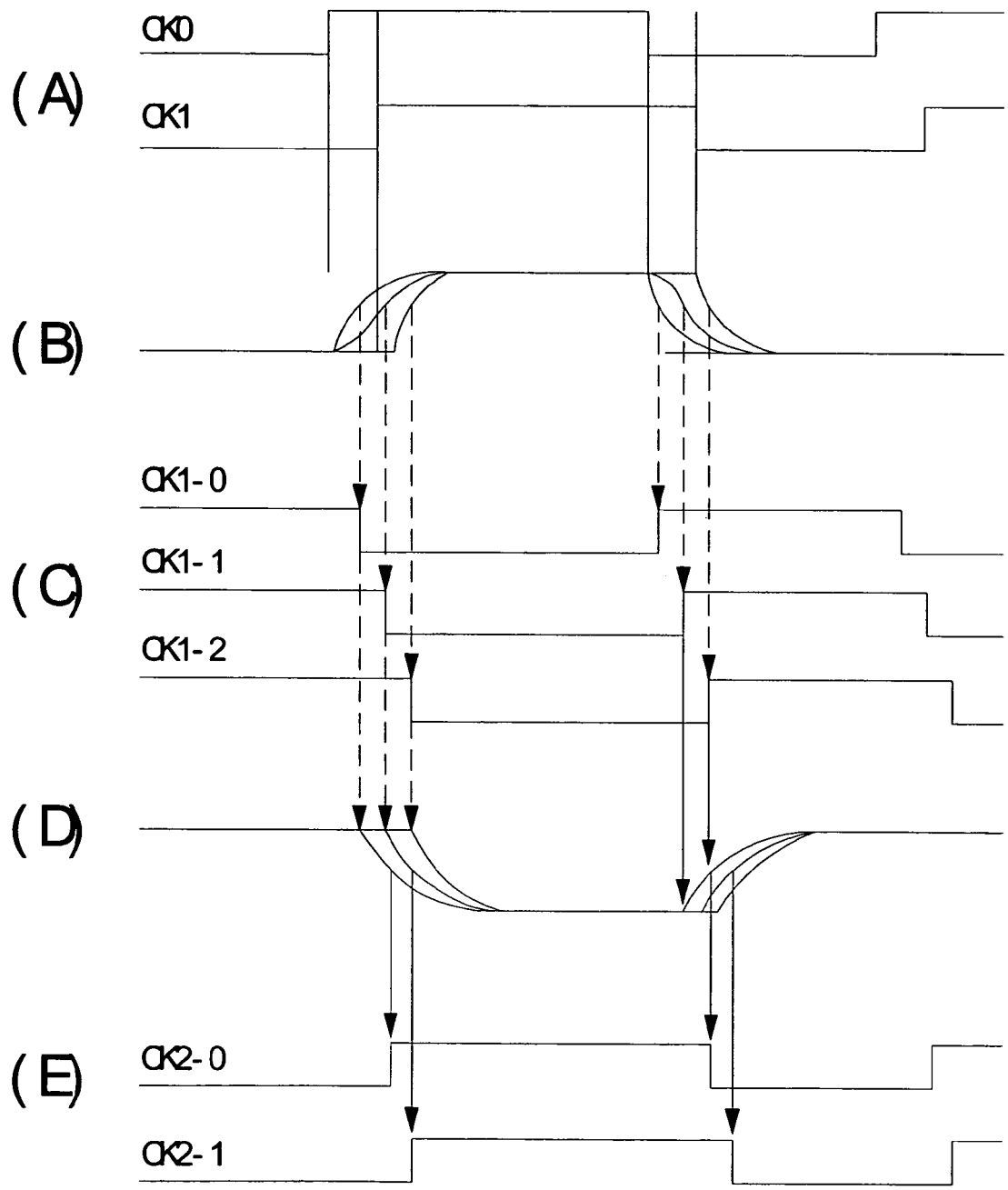
FIG. 7A, FIG. 7B, FIG. 7C and FIG. 7D and FIG. 7E are schematic diagrams showing the waveform in different clock-pulse signals generated by the device shown in FIG. 6.

The wave forms shown in FIG. 7A schematically illustrate an example of the first clock signal CK0 and the second clock signal CK1. The FIG. 7B illustrates the signal of the common output end 30 of the first-stage phase-interpolation circuit. For some uncertainties as mentioned above, the middle phase might drift as shown in FIG. 7B. The middle phase obtained after the process of the third inverter 33 is shown in FIG. 7C. The schematics of the signal of the common output end 30 in the second-stage phase-interpolation circuit connected is shown in FIG. 7D. Because the clock pulse is processed by two stages of same phase-interpolation circuits, the leading and following clock pulses are in the same process of the leading and following paths. In addition, the interpolation of the phases is also facing the same process of the phase-interpolation of the rising and falling edges. Therefore, unbalance of the NMOS and PMOS as well as other uncertain effects can be averaged to compensate the non-linearity of the phase distribution. As shown in FIG. 7E, the output wave forms of the third clock signal CK2-0 and the fourth clock signal CK2-1 will have phases uniformly distributed in a period of clock pulse. Experimental simulation indicates that the error of the linear distribution of the phase will be smaller than 0.1%. The signal is processed in the rising and falling edges of the phase-interpolation circuit which corrects the 50% duty cycle of the output clock pulse because of the characteristics of the phase-interpolation of the inversion. Experimental simulation indicates that the error of the duty cycle will be smaller than 1% and will not be influenced by aforementioned uncertainties. We can improve the linearity of the phase and the 50% duty cycle of the phase-interpolation distribution after the phase-interpolation module and the phase averaging module. Applications for the novel circuit disclosed in the present invention will be improved vastly.

Figure 8:
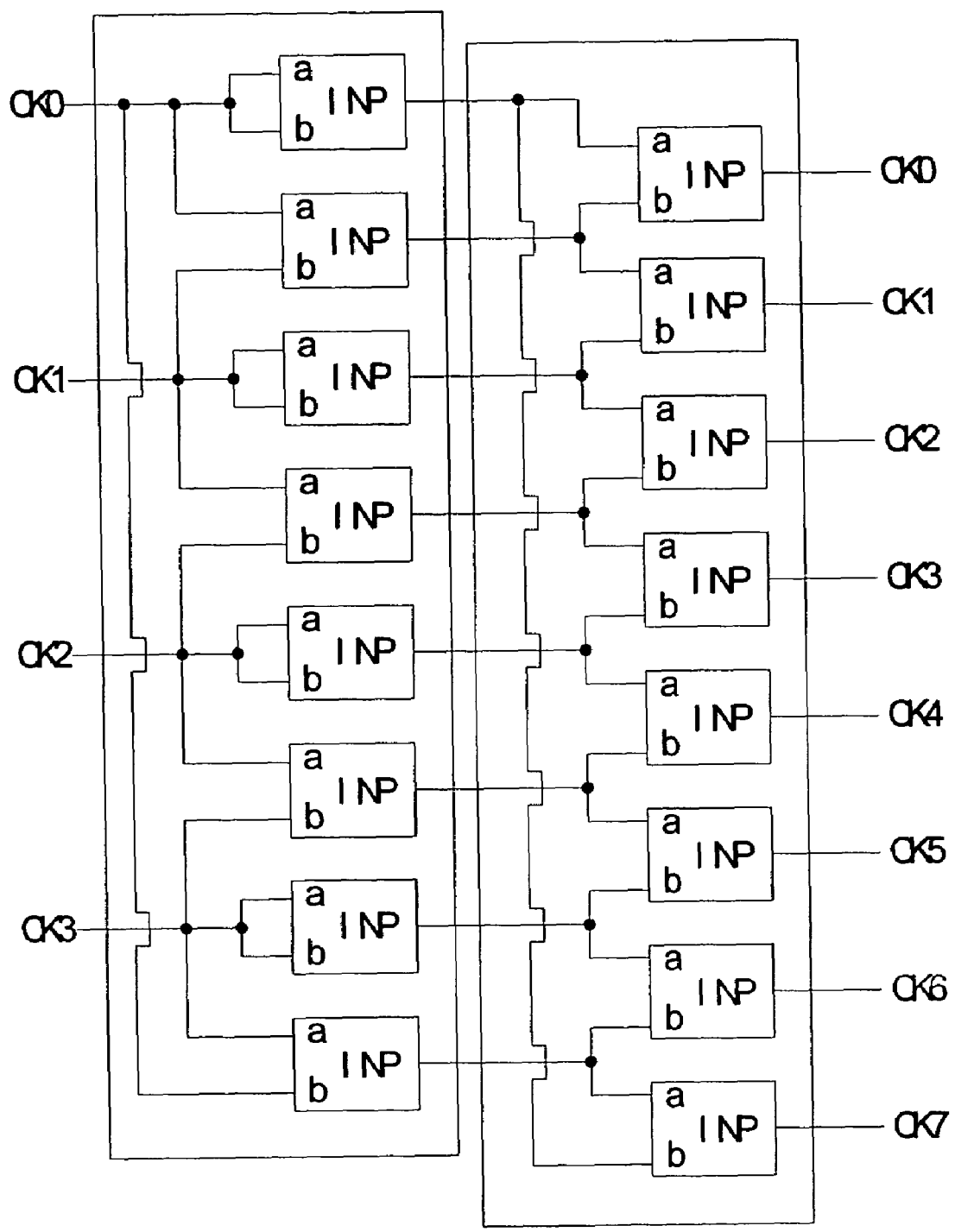
FIG. 8 is a schematic diagram illustrating another preferred embodiment of the phase-interpolation signal generating device of the present invention which can generate eight output multiphase signals based on four input multiphase signals.

FIG. 8 is a schematic diagram illustrating another preferred embodiment of the phase-interpolation signal generating device of the present invention which can generate eight output multiphase signals (CK0-CK7 of the output ends) based on four input multiphase signals (CK0-CK3 of the input ends).

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment without departing from the scope and the spirit of the present invention.

What is claimed is:

1. A phase-interpolation circuit for outputting a third clock signal according to a first clock signal and a second clock signal, the circuit comprising:
    a first inverter for receiving the first clock signal;
    a second inverter for receiving the second clock signal, wherein an output end of the second inverter is coupled to an output end of the first inverter to form a common output end to output the third clock signal;
    a first controlled switch coupled to the first inverter, the second inverter, and a power source, wherein the first controlled switch is "off" when the first clock signal is in a first state, and is "on" when the first clock signal is in a second state; and
    a second controlled switch coupled to the first inverter, the second inverter, and ground, wherein the second controlled switch is "on" when the first clock signal is in the first state, and is "off" when the first clock signal is in the second state;
    wherein the phase of the third clock signal is determined by the phase of the first clock signal and the second clock signal; and
    wherein the first controlled switch and the second controlled switch serve to avoid a short-circuit current of the phase-interpolation circuit.

2. The phase-interpolation circuit of claim 1, wherein the circuit further comprises a third inverter coupled to the common output end to output the third clock signal.

3. The phase-interpolation circuit of claim 1, wherein the circuit further comprises:
    a fourth inverter to output the first clock signal to the first inverter; and
    a fifth inverter to output the second clock signal to the second inverter.

4. The phase-interpolation circuit of claim 1, wherein the first controlled switch comprises:
    a first PMOS coupled between the first inverter and the power source, the first PMOS being "off" when the first clock signal is in the first state, and being "on" when the first clock signal is in the second state; and
    a second PMOS coupled between the second inverter and the power source, the second PMOS being "off" when the first clock signal is in the first state, and being "on" when the first clock signal is in the second state.

5. The phase-interpolation circuit of claim 1, wherein the second controlled switch comprises:
    a first NMOS coupled between the first inverter and the ground, the first NMOS being "off" when the first clock signal is in the second state, and being "on" when the first clock signal is in the first state; and
    a second NMOS coupled between the second inverter and the ground, the second NMOS being "off" when the first clock signal is in the second state, and being "on" when the first clock signal is in the first state.

6. The phase-interpolation circuit of claim 1, wherein the first controlled switch at least includes a PMOS.

7. The phase-interpolation circuit of claim 1, wherein the second controlled switch at least includes a NMOS.

8. The phase-interpolation circuit of claim 1, wherein the first and the second inverter are CMOS inverters.

9. A phase-interpolation circuit for outputting a third clock signal according to a first clock signal and a second clock signal, the circuit comprising:
    a first inverter for receiving the first clock signal;
    a second inverter for receiving the second clock signal, wherein an output end of the second inverter is coupled to an output end of the first inverter to form a common output end to output the third clock signal;
    a first controlled switch coupled to the first inverter, the second inverter, and a power source, wherein the first controlled switch is "off" when the first clock signal is in a first state, and is "on" when the first clock signal is in a second state; and
    a second controlled switch coupled to the first inverter, the second inverter, and ground, wherein the second controlled switch being is "on" when the first clock signal is in the first state, and is "off" when the first clock signal is in the second state;
    wherein the first controlled switch and the second controlled switch are to avoid a short-circuit current of the phase-interpolation circuit.

10. The phase-interpolation circuit of claim 9, wherein the circuit further comprises a third inverter coupled to the common output end to output the third clock signal.

11. The phase-interpolation circuit of claim 9, wherein the circuit further comprises:
    a fourth inverter to output the first clock signal to the first inverter; and
    a fifth inverter to output the second clock signal to the second inverter.

12. The phase-interpolation circuit of claim 9, wherein the first controlled switch comprises:
    a first PMOS coupled between the first inverter and the power source, the first PMOS being "off" when the first clock signal is in the first state, and being "on" when the first clock signal is in the second state; and
    a second PMOS coupled between the second inverter and the power source, the second PMOS being "off" when the first clock signal is in the first state, and being "on" when the first clock signal is in the second state.

13. The phase-interpolation circuit of claim 9, wherein the second controlled switch comprises:
    a first NMOS coupled between the first inverter and the ground, the first NMOS being "off" when the first clock signal is in the second state, and being "on" when the first clock signal is in the first state; and
    a second NMOS coupled between the second inverter and the ground, the second NMOS being "off" when the first clock signal is in the second state, and being "on" when the first clock signal is in the first state.

14. The phase-interpolation circuit of claim 9, wherein the first controlled switch at least includes a PMOS.

15. The phase-interpolation circuit of claim 9, wherein the second controlled switch at least includes a NMOS.

16. The phase-interpolation circuit of claim 9, wherein the first and the second inverter are CMOS inverters.

17. A phase-interpolation circuit for outputting a third clock signal according to a first clock signal and a second clock signal, the circuit comprising:
    a first inverter for receiving the first clock signal;
    a second inverter for receiving the second clock signal, wherein an output end of the second inverter is coupled to an output end of the first inverter to form a common output end to output the third clock signal;
a first controlled switch coupled to the first inverter, the second inverter, and a power source; and
a second controlled switch coupled to the first inverter, the second inverter, and a ground;
wherein the first controlled switch is turned "off" and the second controlled switch is turned "on" when the first clock signal is in a first state, and the first controlled switch is turned "on" and the second controlled switch is turned "off" when the first clock signal is in a second state.

18. The phase-interpolation circuit of claim 17, wherein the circuit further comprises a third inverter coupled to the common output end to output the third clock signal.

19. The phase-interpolation circuit of claim 17, wherein the circuit further comprises:
a fourth inverter to output the first clock signal to the first inverter; and
a fifth inverter to output the second clock signal to the second inverter.

20. The phase-interpolation circuit of claim 17, wherein the first controlled switch comprises:

a first PMOS coupled between the first inverter and the power source, the first PMOS being turned "off" when the first clock signal is in the first state, and being turned "on" when the first clock signal is in the second state; and
a second PMOS coupled between the second inverter and the power source, the second PMOS being turned "off" when the first clock signal is in the first state, and being turned "on" when the first clock signal is in the second state.

21. The phase-interpolation circuit of claim 17, wherein the second controlled switch comprises:
a first NMOS coupled between the first inverter and the ground, the first NMOS being turned "on" when the first clock signal is in the first state, and being turned "off" when the first clock signal is in the second state; and
a second NMOS coupled between the second inverter and the ground, the second NMOS being turned "on" when the first clock signal is in the first state, and being turned "off" when the first clock signal is in the second state.

* * * * *